US008148179B2

(12) United States Patent
Aitken et al.

(10) Patent No.: US 8,148,179 B2
(45) Date of Patent: Apr. 3, 2012

(54) HERMETICALLY SEALED GLASS PACKAGE AND METHOD OF FABRICATION

(75) Inventors: Bruce G. Aitken, Corning, NY (US); Paul S. Danielson, Corning, NY (US); James E. Dickinson, Jr., Corning, NY (US); Stephan L. Logunov, Corning, NY (US); Robert Morena, Lindley, NY (US); Mark L. Powley, Campbell, NY (US); Kamjula P. Reddy, Corning, NY (US); Joseph F. Schroeder, III, Corning, NY (US); Alexander Streltsov, Chandler, AZ (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 12/725,648

(22) Filed: Mar. 17, 2010

(65) Prior Publication Data

US 2010/0186449 A1 Jul. 29, 2010

Related U.S. Application Data

(63) Continuation of application No. 10/965,453, filed on Oct. 13, 2004, now abandoned, which is a continuation-in-part of application No. 10/414,653, filed on Apr. 16, 2003, now abandoned.

(51) Int. Cl.
*H01L 21/00* (2006.01)
(52) U.S. Cl. ............... 438/22; 438/24; 25/40; 25/82; 25/83; 257/E51.05; 257/E51.026
(58) Field of Classification Search .............. 257/40, 257/82–83, 99–100; 438/22, 24; 313/504, 313/512
See application file for complete search history.

(56) References Cited

U.S. PATENT DOCUMENTS

| 3,217,088 | A | | 11/1965 | Steierman | 174/52 |
|---|---|---|---|---|---|
| 3,885,974 | A | | 5/1975 | Asahara et al. | 501/46 |
| 4,279,785 | A | | 7/1981 | Stewart et al. | 252/519.3 |
| 4,297,004 | A | | 10/1981 | Nishimura et al. | 349/138 |
| 5,304,518 | A | | 4/1994 | Sunahara et al. | 501/62 |
| 5,489,321 | A | * | 2/1996 | Tracy et al. | 65/43 |

(Continued)

FOREIGN PATENT DOCUMENTS

EP 0 261 885 3/1988

(Continued)

*Primary Examiner* — A. Sefer
(74) *Attorney, Agent, or Firm* — Kevin M. Able (57) ABSTRACT

A hermetically sealed glass package and method for manufacturing the hermetically sealed glass package are described herein using an OLED display as an example. In one embodiment, the hermetically sealed glass package is manufactured by providing a first substrate plate and a second substrate plate. The second substrate contains at least one transition or rare earth metal such as iron, copper, vanadium, manganese, cobalt, nickel, chromium, neodymium and/or cerium. A sensitive thin-film device that needs protection is deposited onto the first substrate plate. A laser is then used to heat the doped second substrate plate in a manner that causes a portion of it to swell and form a hermetic seal that connects the first substrate plate to the second substrate plate and also protects the thin film device. The second substrate plate is doped with at least one transition metal such that when the laser interacts with it there is an absorption of light from the laser in the second substrate plate, which leads to the formation of the hermetic seal while avoiding thermal damage to the thin-film device. Another embodiment of the hermetically sealed glass package and a method for manufacturing that hermetically sealed glass package are also described herein.

19 Claims, 7 Drawing Sheets

U.S. PATENT DOCUMENTS

| | | | |
|---|---|---|---|
| 5,747,396 A * | 5/1998 | Miyakoshi et al. | 501/32 |
| 6,103,648 A | 8/2000 | Yi | 501/46 |
| 6,124,224 A | 9/2000 | Sridharan et al. | 501/15 |
| 6,383,664 B2 | 5/2002 | Bernius et al. | 428/690 |
| 6,383,961 B1 | 5/2002 | Ryu | 501/32 |
| 6,914,371 B2 | 7/2005 | Martin et al. | 313/292 |
| 7,148,624 B2 | 12/2006 | Guenther et al. | 313/512 |
| 2002/0035852 A1 | 3/2002 | Wang et al. | 65/34 |
| 2003/0107315 A1 | 6/2003 | Chen et al. | 313/512 |
| 2003/0114291 A1 | 6/2003 | Koyama et al. | 501/64 |
| 2003/0193289 A1 | 10/2003 | Shirakawa et al. | 313/512 |
| 2003/0203205 A1 | 10/2003 | Bi et al. | 428/402 |
| 2004/0104673 A1 | 6/2004 | Hosokawa et al. | 313/512 |
| 2004/0159849 A1 | 8/2004 | Negley | 257/98 |
| 2004/0206953 A1 | 10/2004 | Morena et al. | 357/40 |
| 2005/0116245 A1 | 6/2005 | Aitken et al. | 257/99 |

FOREIGN PATENT DOCUMENTS

| | | | |
|---|---|---|---|
| EP | 0 321 297 | | 6/1989 |
| GB | 1298397 | | 4/1970 |
| JP | 64-37532 | * | 2/1989 |
| JP | 01-225140 | | 8/1989 |
| JP | 02-112196 | | 4/1990 |
| JP | 10-74583 | * | 3/1998 |
| JP | 11-97169 | * | 4/1999 |
| JP | 2001-118674 | * | 4/2001 |
| JP | 2001-319775 | * | 11/2001 |
| WO | 96/02473 | | 2/1996 |
| WO | WO 97/30947 | | 8/1997 |
| WO | WO 99/32282 | | 7/1999 |
| WO | WO 00/69002 | | 11/2000 |
| WO | WO 02/21557 | | 3/2002 |

* cited by examiner

HERMETICALLY SEALED GLASS PACKAGE AND METHOD OF FABRICATION

CROSS REFERENCE TO RELATED APPLICATION

This application in a continuation application of U.S. patent application Ser. No. 10/965,453, filed on Oct. 13, 2004, now abandoned which is a continuation-in-part application of U.S. patent application Ser. No. 10/414,653, filed Apr. 16, 2003 now abandoned, the contents of these applications being incorporated by reference herein.

BACKGROUND OF THE INVENTION

1. Field of the Invention

The present invention relates to hermetically sealed glass packages that are suitable to protect thin film devices that are sensitive to the ambient environment. Some examples of such devices are organic emitting light diode (OLED) displays, sensors, and other optical devices. The present invention is demonstrated using OLED displays as an example.

2. Description of Related Art

OLEDs have been the subject of a considerable amount of research in recent years because of their use and potential use in a wide variety of electroluminescent devices. For instance, a single OLED can be used in a discrete light emitting device or an array of OLEDs can be used in lighting applications or flat-panel display applications (e.g., OLED displays). The OLED displays are known as being very bright and having a good color contrast and wide viewing angle. However, the OLED displays and in particular the electrodes and organic layers located therein are susceptible to degradation resulting from interaction with oxygen and moisture leaking into the OLED display from the ambient environment. It is well known that the lifetime of the OLED display can be significantly increased if the electrodes and organic layers within the OLED display are hermetically sealed from the ambient environment. Unfortunately, in the past it was very difficult to develop a sealing process to hermetically seal the OLED display. Some of the factors that made it difficult to properly seal the OLED display are briefly mentioned below:

- The hermetic seal should provide a barrier for oxygen ($10^{-3}$ cc/m$^2$/day) and water ($10^{-6}$ g/m$^2$/day).
- The size of the hermetic seal should be minimal (e.g., <1 mm) so it does not have an adverse effect on size of the OLED display.
- The temperature generated during the sealing process should not damage the materials (e.g., electrodes and organic layers) within the OLED display. For instance, the first pixels of OLEDs, which are located about 1 mm from the seal in the OLED display should not be heated to more than 85° C. during the sealing process.
- The gases released during sealing process should not contaminate the materials within the OLED display.
- The hermetic seal should enable electrical connections (e.g., thin-film chromium) to enter the OLED display.

Today the most common way for sealing the OLED display is to use different types of epoxies with inorganic fillers and/or organic materials that form the seal after they are cured by ultra-violet light. Although these types of seals usually provide good mechanical strength, they can be very expensive and there are many instances in which they have failed to prevent the diffusion of oxygen and moisture into the OLED display. In fact, these epoxy seals need to use a desiccant to get an acceptable performance. Another potential way for sealing the OLED display is to utilize metal welding or soldering, however, the resulting seal can suffer from the problematical shorting of the electrical leads which enter the OLED display. This sealing process is also very complex since several thin film layers are necessary to get good adhesion. Accordingly, there is a need to address the aforementioned problems and other shortcomings associated with the traditional seals and the traditional ways for sealing the OLED displays. These needs and other needs are satisfied by the hermetic sealing technology of the present invention.

BRIEF DESCRIPTION OF THE INVENTION

The present invention includes a hermetically sealed OLED display and method for manufacturing the hermetically sealed OLED display. In one embodiment, the hermetically sealed OLED display is manufactured by providing a first substrate plate and a second substrate plate. The second substrate contains at least one transition or rare earth metal such as iron, copper, vanadium, manganese, cobalt, nickel, chromium, neodymium and/or cerium. OLEDs are deposited onto the first substrate plate. A laser is then used to heat the doped second substrate plate in a manner that causes a portion of it to swell and form a hermetic seal that connects the first substrate plate to the second substrate plate and also protects the OLEDs. The second substrate plate is doped with at least one transition or rare earth metal such that when the laser energy is absorbed there is an increase in temperature in the sealing area. Another embodiment for manufacturing OLED displays is also described herein.

BRIEF DESCRIPTION OF THE DRAWINGS

A more complete understanding of the present invention may be obtained by reference to the following detailed description when taken in conjunction with the accompanying drawings wherein.

DETAILED DESCRIPTION OF THE DRAWINGS

Referring to FIGS. 1-13, there are disclosed in accordance with the present invention three embodiments of hermetically sealed OLED displays 100', 100'' and 100'''. Although the sealing process of the present invention is described below with respect to the fabrication of hermetically sealed OLED displays 100', 100'' and 100''', it should be understood that the same or similar sealing process can be used in other applications to protect sensitive optical/electronic devices that are disposed between two glass plates. Accordingly, the present invention should not be construed in a limited manner.

Figure 1A:
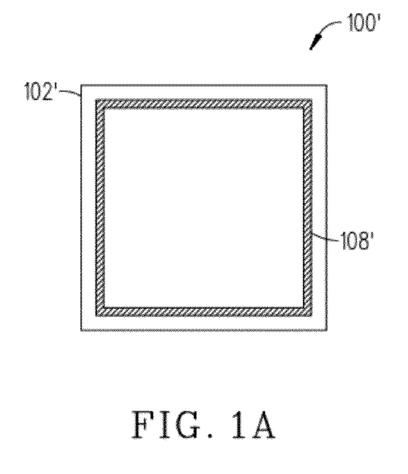
FIGS. 1A and 1B are a top view and a cross-sectional side view illustrating the basic components of a hermetically sealed OLED display in accordance with a first embodiment of the present invention.
Figure 1B:
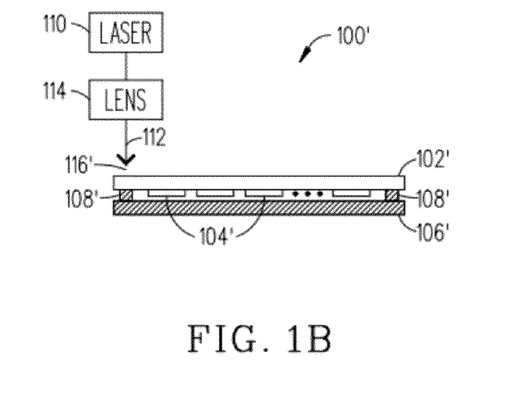

Referring to FIGS. 1A and 1B there are a top view and a cross-sectional side view illustrating the basic components of the first embodiment of the hermetically sealed OLED display 100'. The OLED display 100' includes a multilayer sandwich of a substrate plate 102' (e.g., glass plate 102'), an array of OLEDs 104' and a sealing glass plate 106' that was doped with at least one transition or rare earth metal such as iron, copper, vanadium, manganese, cobalt, nickel, chromium, neodymium and/or cerium (for example). The OLED display 100' has a hermetic seal 108' formed from the sealing glass plate 106', which protects the OLEDs 104' located between the substrate plate 102' and the sealing glass plate 106'. The hermetic seal 108' is typically located just inside the outer edges of the OLED display 100'. And, the OLEDs 104' are located within the perimeter of the hermetic seal 108'. How the hermetic seal 108' is formed from the sealing glass plate 106' and the components such as the laser 110 and lens 114, which are used for forming the hermetic seal 108' are described in greater detail below with respect to FIGS. 2-9.

Figure 2:
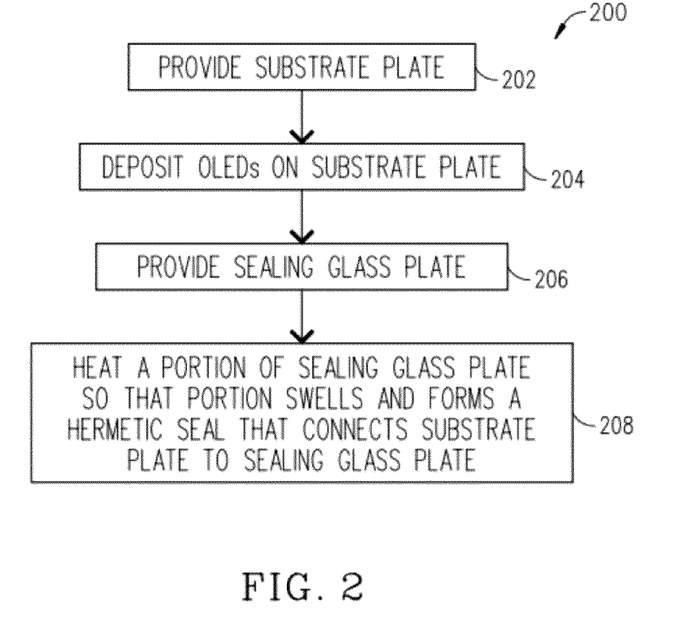
FIG. 2 is a flowchart illustrating the steps of a preferred method for manufacturing the hermetically sealed OLED display shown in FIGS. 1A and 1B.

Referring to FIG. 2, there is a flowchart illustrating the steps of the preferred method 200 for manufacturing the hermetically sealed OLED display 100'. Beginning at step 202, the substrate plate 102' is provided so that one can make the OLED display 100'. In the preferred embodiment, the substrate plate 102' is a transparent glass plate like the one manufactured and sold by Corning Incorporated under the brand names of Code 1737 glass or Eagle 2000™ glass. Alternatively, the substrate plate 102' can be a transparent glass plate like the ones manufactured and sold by the companies like Asahi Glass Co. (e.g., OA10 glass and OA21 glass), Nippon Electric Glass Co., NHTechno and Samsung Corning Precision Glass Co. (for example).

At step 204, the OLEDs 104' and other circuitry are deposited onto the substrate plate 102'. The typical OLED 104' includes an anode electrode, one or more organic layers and a cathode electrode. However, it should be readily appreciated by those skilled in the art that any known OLED 104' or future OLED 104' can be used in the OLED display 100'. It should also be appreciated that this step can be skipped if an OLED display 100' is not being made but instead a glass package is being made using the sealing process of the present invention.

At step 206, the sealing glass plate 106' is provided so that one can make the OLED display 100'. In the preferred embodiment, the sealing glass plate 106' is made from a borosilicate (multicomponent) glass that is doped with at least one transition or rare earth metal such as iron, copper, vanadium, manganese, cobalt, nickel, chromium, neodymium and/or cerium (for example). The compositions of several exemplary sealing glass plates 106' are provided below with respect to TABLES 1-5.

At step 208, a predetermined portion 116' of the sealing glass plate 106' is heated in a manner so that portion 116' of the sealing glass plate 106' can swell and form the hermetic seal 108' (see FIG. 1B). The hermetic seal 108' connects and bonds the substrate plate 102' to the sealing glass plate 106'. In addition, the hermetic seal 108' protects the OLEDs 104' from the ambient environment by preventing oxygen and moisture in the ambient environment from entering into the OLED display 100'. As shown in FIGS. 1A and 1B, the hermetic seal 108' is typically located just inside the outer edges of the OLED display 100'.

In the preferred embodiment, step 208 is performed by using a laser 110 that emits a laser beam 112 through a lens 114 (optional) and through the substrate plate 102' so as to heat the predetermined portion 108' of the doped sealing glass plate 106' (see FIG. 1B). The substrate plate 102' does not absorb the laser energy which helps minimize heat dissipation to organic layers in the OLED device. The laser beam 112 is moved such that it effectively heats a portion 116' of the doped sealing glass plate 106' and causes that portion 116' of the sealing glass plate 106' to swell and form the hermetic seal 108'. The laser 110 has a laser beam 112 with a specific wavelength and the sealing glass plate 106' is doped with a transition or rare earth metal so as to enhance its absorption property at the specific wavelength of the laser beam 112. This connection between the laser 110 and sealing glass plate 106' means that when the laser beam 112 is emitted onto the doped sealing glass plate 106' at point 116' there is an increase of absorption of the laser beam 112 at that point 116' which causes the sealing glass plate 106' to swell and form the hermetic seal 108'. Because of the increase in the absorption of heat energy in the doped sealing glass plate 106', the laser beam 112 can move relatively fast over the sealing glass plate 106' and form the hermetic seal 108'. And, by being able to move the laser beam 112 fast this in effect minimizes the undesirable transfer of heat from the forming hermetic seal 108' to the OLEDs 104' within the OLED display 100'. Again, the OLEDs 104' should not be heated to more than 85° C. during the operation of the laser 110.

Described below are several experiments that were conducted by one or more of the inventors. Basically, the inventors have experimented with and used different regimes of the laser 110 to connect and bond different types of substrate plates 102' to different types of sealing glass plates 106'. The compositions of these exemplary sealing glass plates 106' are provided in TABLE 1.

TABLE 1

| | Composition Mole % | | | | | | | |
|---|---|---|---|---|---|---|---|---|
| | 1* | 2* | 3* | 4* | 5* | 6* | 7* | 8* |
| SiO$_2$ | 79.8 | 79.5 | 79.2 | 78.6 | 47 | 47 | 47 | 47 |
| Na$_2$O | 5.3 | 5.3 | 5.3 | 5.2 | 0 | 0 | 0 | 0 |
| Al$_2$O$_3$ | 1.2 | 1.1 | 1.1 | 1.1 | 9.0 | 9 | 9 | 9 |

TABLE 1-continued

| | Composition Mole % | | | | | | | |
|---|---|---|---|---|---|---|---|---|
| | 1* | 2* | 3* | 4* | 5* | 6* | 7* | 8* |
| B₂O₃ | 13.7 | 13.7 | 13.6 | 13.5 | 27 | 27 | 27 | 27 |
| Fe₂O₃ | 0 | 0.4 | 0.8 | 1.6 | 0 | 0 | 0 | 0 |
| PbO | 0 | 0 | 0 | 0 | 7 | 0 | 0 | 0 |
| CuO | 0 | 0 | 0 | 0 | 10 | 17 | 10 | 10 |

TABLE 1-continued

| | Composition Mole % | | | | | | | |
|---|---|---|---|---|---|---|---|---|
| | 1* | 2* | 3* | 4* | 5* | 6* | 7* | 8* |
| ZnO | 0 | 0 | 0 | 0 | 0 | 0 | 7 | 0 |
| SrO | 0 | 0 | 0 | 0 | 0 | 0 | 0 | 7 |

*These compositions are associated with the exemplary sealing glass plates 106'.

As can be seen in TABLE 1, each of the exemplary sealing glass plates 106' has a different type and/or concentration of oxides such as Fe₂O₃, PbO, CuO, ZnO, and SrO (for example). It should be noted that some of these elements are not transition or rare earth metals and some of these elements were not added to induce absorption. The sealing glass plates 106' in these experiments had an enhanced optical absorption in the near-infrared region and in particular at the 810-nm wavelength. The selection of transition-metal dopants is based on the glass absorption at the laser wavelength which again in these experiments is 810 nm. The dopants were selected to absorb at the wavelength of the laser beam 112 which in these experiments was 810 nm. And, the substrate plate 102' can be chosen such that it does not absorb at 810 nm. Because the optical absorption of the sealing glass plate 106' is enhanced to correspond with the particular wavelength of the laser 110, the laser 110 is able to move relatively fast to heat the doped sealing glass plate 106' so that it can form the hermetic seal 108' while at the same time not overheat the OLEDs 104'.

It should be readily appreciated that in addition to the aforementioned compositions listed in TABLE 1, there may be other compositions of substrate plates 102' and doped sealing glass plate 106' which exist like those listed in TABLES 3-5 or which have yet to be developed but could be connected to one another in accordance with the present invention to make a desirable OLED display 100'.

The optical absorption measurements from several experiments along with the physical properties of the exemplary substrate plates 102' and exemplary doped sealing glass plates 106' are provided below in TABLE 2.

TABLE 2

| | Composition | | | | | | | | | |
|---|---|---|---|---|---|---|---|---|---|---|
| | 1* | 2* | 3* | 4* | 5* | 6* | 7* | 8* | 1737 | Eagle 2000 |
| Fe₂O₃ or CuO Mole % | 0 | 0.4 | 0.8 | 1.6 | 10 | — | — | — | — | — |
| Thickness (mm) | 2.02 | 2.04 | 2.12 | 2.1 | 0.66 | — | — | — | — | — |
| Transmission % at 810 nm | 92.11 | 46.77 | 15.66 | 0.63 | 0.48 | — | — | — | — | — |
| Absorption coefficient, /mm | 0 | 0.144 | 0.363 | 1.031 | 3.46 | — | — | — | — | — |
| % Absorbed in 100 micron layer | 0 | 3 | 7.4 | 19.4 | 50.5 | — | — | — | — | — |
| % Absorbed in 200 micron layer | 0 | 5.9 | 14.2 | 34.8 | 73.3 | — | — | — | — | — |
| Thermal Expansion (ppm/° C.) to strain point | — | — | — | 3.9 | 3.7 | 3.0 | 3.35 | 4.2 | 4.2 | 3.61 |
| Annealing Temperature (° C.) | — | — | — | — | — | 482 | 526 | 526 | 721 | 722 |
| Strain Point (° C.) | — | — | — | — | — | 443 | 486 | 488 | 666 | 666 |

*These compositions are associated with the exemplary sealing glass plates 106'.

As can be seen in TABLE 2, the desired degree of laser energy absorption can be achieved by: (1) selecting the particular transition or rare earth metal(s) to be incorporated within the sealing glass plate 106' and (2) selecting the concentration or amount of transition or rare earth metal(s) to be incorporated within the sealing glass plate 106'.

EXPERIMENT #1

Figure 3A:
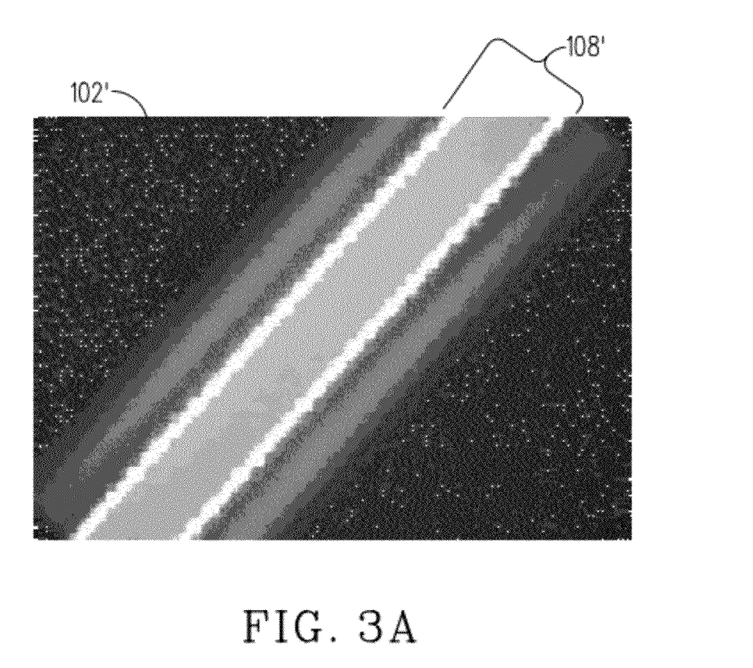
FIGS. 3A and 3B are photographs of partial top views of a substrate plate and sealing glass plate that were at least partially sealed to one another using a 20 watt laser and a 25 watt laser in accordance with the method shown in FIG. 2.
Figure 3B:
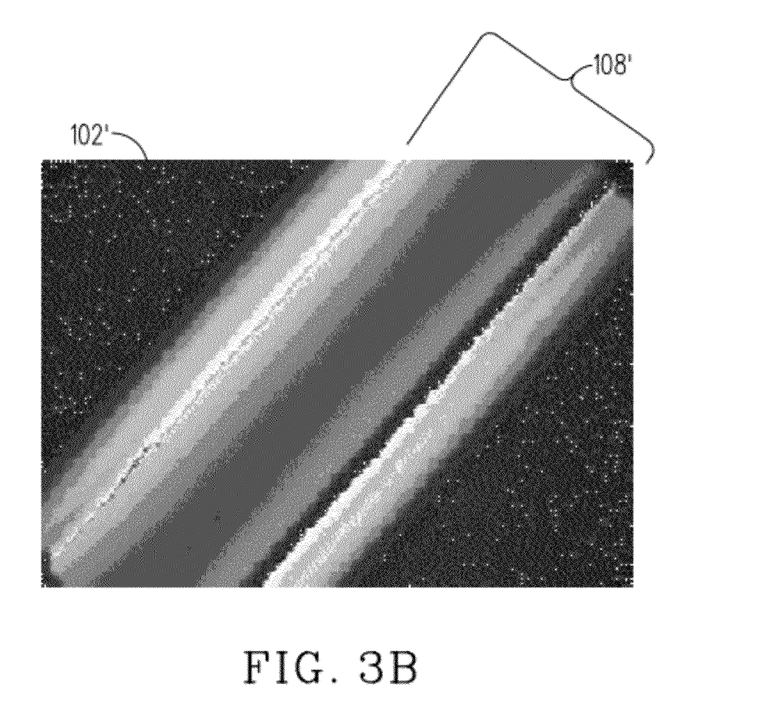
Figure 4:
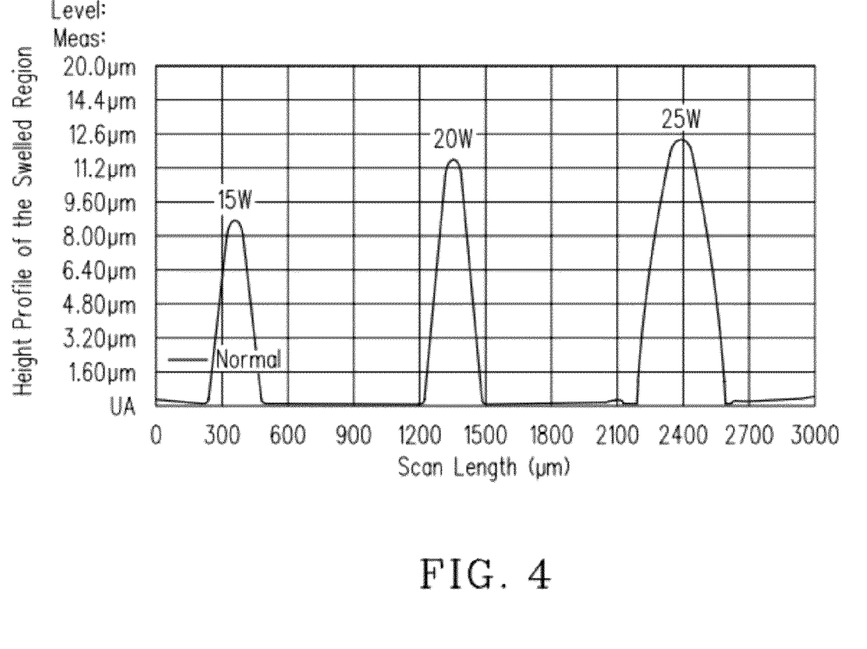
FIG. 4 is a graph that shows the profiles of the swelled region on the free surface of the first embodiment of the doped substrate plate that were made using a 810 nm laser operating at 15 watts, 20 watts and 25 watts.
Figure 5:
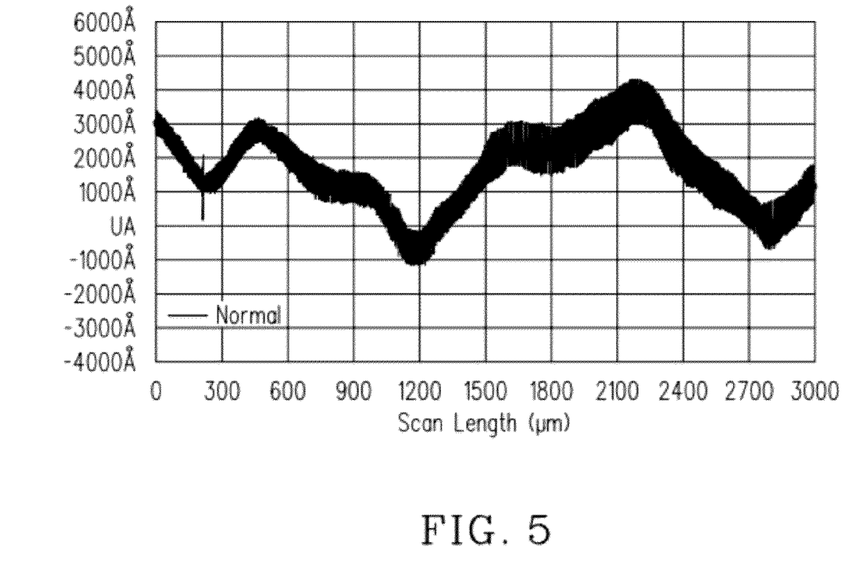
FIG. 5 is a graph that shows the height variation of the swelled region shown in FIG. 4 for the laser operating at 20 watts.

In this experiment, a 25 watt laser 110 was used to focus a 810 nm continuous-wave laser beam 112 through the substrate plate 102' (e.g., 1737 glass substrate) onto the sealing glass plate 106' (composition no. 4) (see FIG. 1B). The laser beam 112 moved at a speed of 1 cm/s to form the seal 108' which connected the substrate plate 102' to the sealing glass plate 106'. FIGS. 3A and 3B are photographs taken by an optical microscope of partial top views of two plates 102' and 106' that were at least partially connected to one another using a 25 watt laser beam 112. As can be seen, very good seals 108' were obtained when the laser 100 had a power setting of 20 and 25 watts. The seals 108' are approximately 250 microns wide in FIG. 3A and 260 microns wide in FIG. 3B. The sealing glass plate 106' swelled and formed a miniscule or ridge during melting which created a gap of approximately microns between the substrate plate 102' and sealing glass plate 106'. This gap is sufficient to accommodate OLEDs 104' (not present) which are approximately 2 microns thick. The profiles of the ridges at various laser powers are shown in the graph of FIG. 4. As can be seen, the height of the ridges ranged from approximately 9 μm using a 15 watt laser 110 to approximately 12.5 μm using a 25 watt laser 110. The graph in FIG. 5 shows the height variation of the ridge made by the 20-watt laser. This ridge is relatively uniform over its length since its height fluctuates approximately +/−250 nm.

Figure 6:
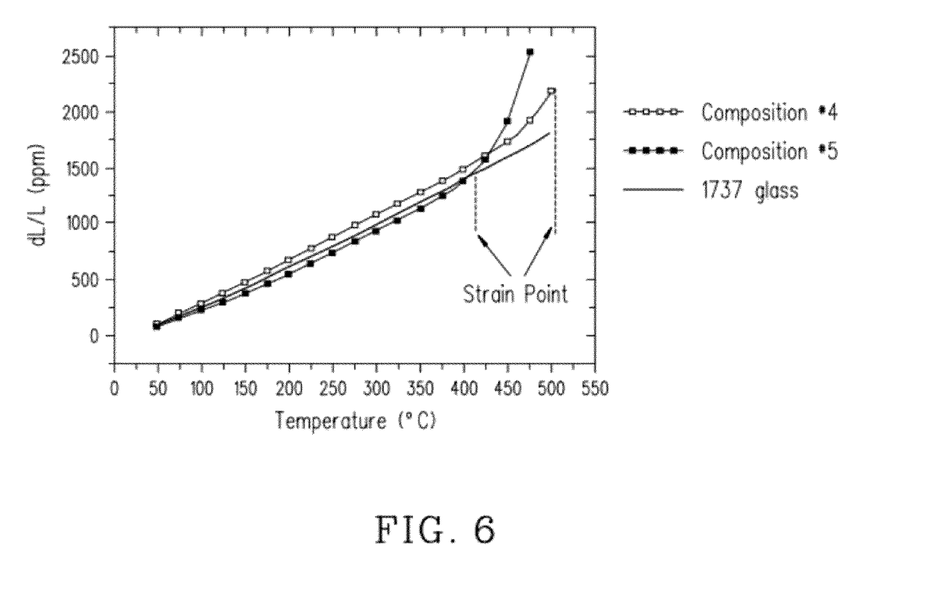
FIG. 6 is a graph that shows the thermal expansion curves of a substrate plate (glass code 1737 made by Corning Inc. and two sealing glass plates (composition nos. 4-5) that can be used to make glass packages in accordance with the method shown in FIG. 2.
Figure 7:
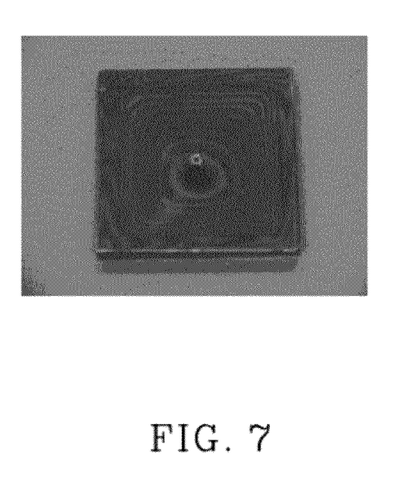
FIG. 7 is a photograph of 1737 substrate plate that was sealed to sealing glass plate (composition no. 5) in experiment #2.
Figure 8:
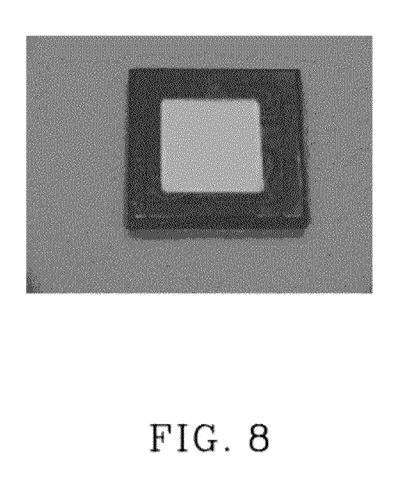
FIG. 8 is a photograph of 1737 substrate plate that was sealed to sealing glass plate (composition no. 5) in experiment #3.

Unfortunately, difficulties were encountered in closing the seal 108' around the edges of the two aforementioned exemplary glass plates 102' and 106' (1737 glass substrate and composition no. 4) due to the presence of significant residual stresses. In particular, cracking was observed if the laser beam 112 passed over an already-swelled region in the sealing glass plate 106' (composition no. 4). Thus, the inventors decided to explore other glass compositions to solve this seal-closing problem. In doing this, the inventors noted that the physical properties (e.g., strain point and thermal expansion) of sealing glass plates 106 and 106' (composition nos. 4 and 5) indicated that it may be possible to lower the problematical residual stresses. FIG. 6 is a graph that shows the thermal expansion curves of the substrate plate 102' (1737 glass substrate) and two sealing glass plates 106' (composition nos. 4 and 5). As can be seen, the mismatch strain between substrate plate 102' (1737 glass substrate) and sealing glass plate 106' (composition no. 5) which is 80 ppm is significantly lower when compared to the mismatch strain between substrate plate 102' (1737 glass substrate) and sealing glass plate 106' (composition no. 4) which is 360 ppm. As such, when a laser 110 was used to connect substrate plate 102' (1737 glass substrate) to sealing glass plate 106' (composition no. 5) cracks were not present when the seal 108' crossed over itself at 90°. Moreover, because the sealing glass plate 106' (composition no. 5) is softer and contains more energy absorbing transition metal(s) than sealing glass plate 106' (composition no. 4), the laser power required for good sealing was 50% less when compared to the laser power needed to seal the sealing glass plate 106' (composition no. 4).

EXPERIMENT #2

To test the gas leakage through the seal 108' between two plates 102' and 106', a helium-leak test was developed. A 50×50×0.7 mm substrate plate 102'(1737 glass substrate) with a 3 mm diameter hole at its center was sealed to a 50×50×4 mm sealing glass plate 106' (composition no. 5) (see photograph in FIG. 7). The sample was sealed using a 810 nm laser 110 with a power of 8.5 W and velocity of 15 mm/s. After sealing the two plates 102' and 106', the pressure in the sealed cavity was reduced by connecting a vacuum pump to the hole in the substrate plate 102'. The sealed region was pumped down to a pressure of <50 m-torr and helium gas was sprayed around the outer edge of the seal 108'. The helium gas leak rate through the seal 108' was measured with a detector. The lowest helium leak rate that can be measured with the apparatus is $1 \times 10^{-8}$ cc/s. The Helium leak rate through the seal 108' was below the detection limit of the instrument. This is indicative of a very good seal 108'.

EXPERIMENT #3

To further test the gas leakage through the seal 108' in the two plates 102' and 106' of experiment #2, a calcium leak test was developed. Using an evaporation technique, a thin film of calcium approximately 31×31×0.0005 mm was deposited on a 50×50×0.7 mm substrate plate 102' (1737 glass substrate). This plate was sealed to a 50×50×4 mm sealing glass plate 106' (composition no. 5) under the same sealing conditions described in experiment #2. To demonstrate hermetic performance, the sealed plates 102' and 106' were aged in (85° C./85RH environment (see photograph in FIG. 8). This sample was visually inspected periodically to determine whether there was any change in the appearance of the calcium film. If the calcium film is not protected, it reacts with the moisture in the ambient and becomes transparent in a few hours. There was no change in the appearance of calcium film after aging for 2000 hours in the 85° C./85RH environment. This is indicative of a very good seal 108'.

EXPERIMENT #4

Figure 9:
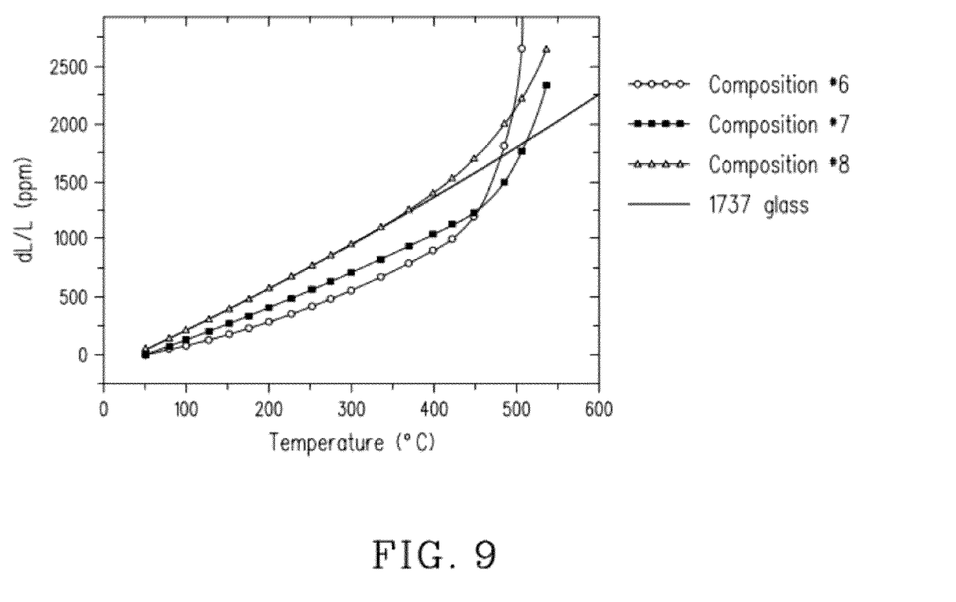
FIG. 9 is a graph that shows the thermal expansion curves of 1737 and three sealing glass plates (composition nos. 6-8) that can be used to make glass packages in accordance with the method shown in FIG. 2.

The sealing glass plate 106' (composition no. 5) contains lead (PbO) in its composition. Glasses containing lead are not generally preferred because of environmental concerns. Therefore, several lead free glass compositions were tested. The compositions of these sealing glass plates 106' (composition nos. 6-8) were provided in TABLE 1 and their physical properties are given in Table 2. The thermal expansion curves of sealing glass plates 106' (composition nos. 6-8) and substrate plate 102' (1737 glass substrate) are shown in FIG. 9. All of these sealing glass plates 106' showed swelling during heating and excellent bonding to substrate plate 102' (1737 glass substrate). A sample of sealing glass plate 106' (composition no. 7) was sealed to substrate glass plate 102' (1737 glass substrate) for calcium test. The sealing was done with an 8.5 watt laser 110 having a velocity of 15 mm/sec. The sample was aged in 85° C./85RH environment to determine hermetic performance. There was no change in the appearance of the calcium film even though the sample was exposed to this severe moist environment for more than 1800 hours.

EXPERIMENT #5

Four calcium test samples were made with substrate plate 102' (1737 glass substrate) and sealing glass plate 106' (composition no. 7) using the same sealing conditions described in experiment #4. These samples were subjected to a thermal cycling test between −40° C. to 85° C. The rate of heating during temperature cycling was 2° C./rain with 0.5 hour hold at −40° C. and 85° C. (time for each cycle is 3 hours). There was no change in the appearance of the calcium film even after 400 thermal cycles. This indicates that the seal is very robust.

It should be noted that the sealing method of the present invention is very rapid and is also amenable to automation. For example, sealing a 40×40 cm OLED display 100' can take approximately 2 minutes. And, the doped sealing glass plates 106' can be manufactured using a float glass process, a slot draw process or a rolling process since the glass surface quality is not that critical for the sealing plate of front-emitting OLED displays 100'.

Figure 10A:
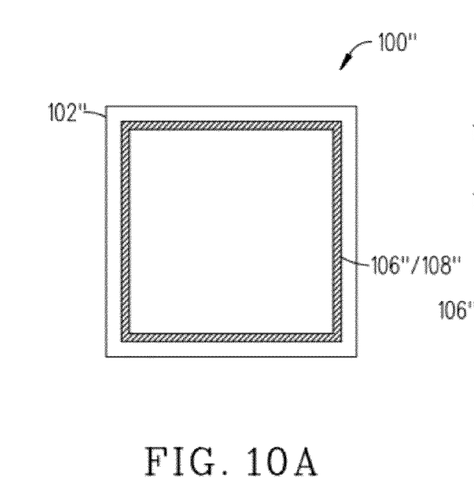
FIGS. 10A and 10B are a top view and a cross-sectional side view illustrating the basic components of a hermetically sealed OLED display in accordance with a second embodiment of the present invention.
Figure 10B:
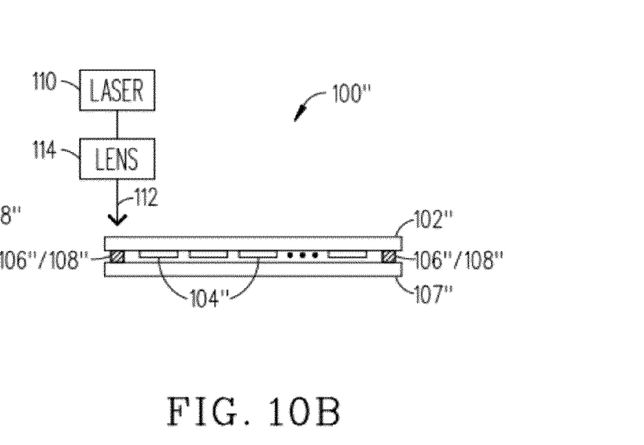

Referring to FIGS. 10A and 10B there are respectively a top view and a cross-sectional side view illustrating the basic components of a second embodiment of the hermetically sealed OLED display 100". The OLED display 100" includes a multi-layer sandwich of a first substrate plate 102" (e.g., glass plate 102"), an array of OLEDs 104", a sealing glass fiber 106" that was doped with at least one transition or rare earth metal such as iron, copper, vanadium, manganese, cobalt, nickel, chromium, neodymium and/or cerium (for example) and a second substrate plate 107" (e.g., glass plate 107"). The OLED display 100" has a hermetic seal 108" formed from the sealing glass fiber 106" which protects the OLEDs 104" located between the first substrate plate 102" and the second substrate plate 107". The hermetic seal 108" is typically located just inside the outer edges of the OLED display 100". And, the OLEDs 104" are located within a perimeter of the hermetic seal 108". How the hermetic seal 108" is formed from the sealing glass fiber 106" and the components such as the laser 110 and lens 114 which are used for forming the hermetic seal 108" are described in greater detail below with respect to the method 1100 and FIGS. 11-12.

Figure 11:
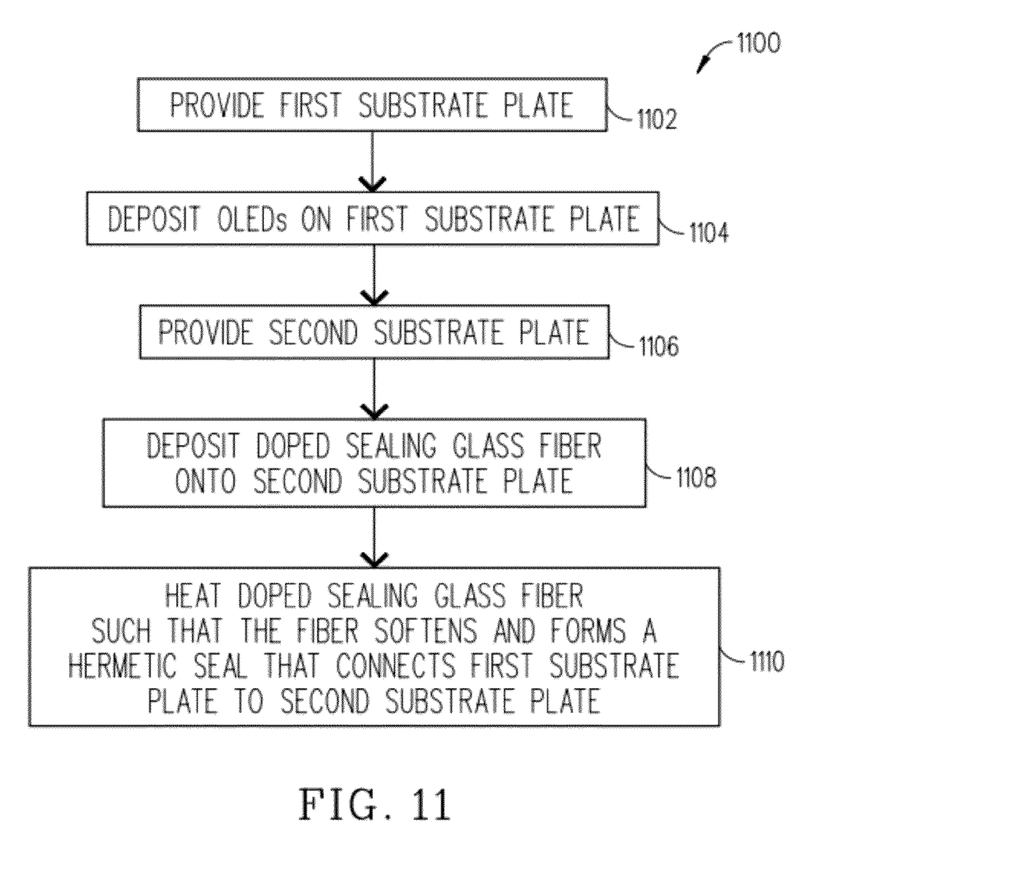
FIG. 11 is a flowchart illustrating the steps of a preferred method for manufacturing the hermetically sealed OLED display shown in FIGS. 10A and 10B.

Referring to FIG. 11, there is a flowchart illustrating the steps of the preferred method 1100 for manufacturing the hermetically sealed OLED display 100". Beginning at step 1102, the first substrate plate 102" is provided so that one can make the OLED display 100". In the preferred embodiment, the first substrate plate 102" is a transparent glass plate like the ones manufactured and sold by Corning Incorporated under the brand names of Code 1737 glass or Eagle 2000™ glass. Alternatively, the first substrate plate 102" can be a transparent glass plate like the ones manufactured and sold by the companies like Asahi Glass Co. (e.g., OA10 glass and OA21 glass), Nippon Electric Glass Co., NHTechno and Samsung Corning Precision Glass Co. (for example).

At step 1104, the OLEDs 104" and other circuitry are deposited onto the first substrate plate 102". The typical OLED 104" includes an anode electrode, one or more organic layers and a cathode electrode. However, it should be readily appreciated by those skilled in the art that any known OLED 104" or future OLED 104" can be used in the OLED display 100". Again, it should be appreciated that this step can be skipped if an OLED display 100" is not being made but instead a glass package is being made using the sealing process of the present invention.

At step 1106, the second substrate plate 107" is provided so that one can make the OLED display 100". In the preferred embodiment, the second substrate plate 107" is a transparent glass plate like the ones manufactured and sold by Corning Incorporated under the brand names of Code 1737 glass or Eagle 2000™ glass. Alternatively, the second substrate plate 107" can be a transparent glass plate like the ones manufactured and sold by the companies like Asahi Glass Co. (e.g., OA10 glass and OA21 glass), Nippon Electric Glass Co., NHTechno and Samsung Corning Precision Glass Co. (for example).

At step 1106, the sealing glass fiber 106" is deposited along the edge of the second substrate plate 107". In the preferred embodiment, the sealing glass fiber 106" has a rectangular shape and is made from a silicate glass that is doped with at least one transition or rare earth metal such as iron, copper, vanadium, manganese, cobalt, nickel, chromium, neodymium and/or cerium (for example). The compositions of several exemplary sealing glass fibers 106" are provided above in TABLES 1

At step 1108, the OLEDs 104" and other circuitry are placed on the first substrate plate 102" or on the second substrate plate 107". The typical OLED 104" includes an anode electrode, one or more organic layers and a cathode electrode. However, it should be readily appreciated by those skilled in the art that any known OLED 104" or future OLED 104" can be used in the OLED display 100".

At step 1110, the sealing glass fiber 106" is heated by the laser 110 (or other heating mechanism such as an infrared lamp) in a manner so that it can soften and form the hermetic seal 108" (see FIG. 10B). The hermetic seal 108" connects and bonds the first substrate plate 102" to second substrate plate 107". In addition, the hermetic seal 108" protects the OLEDs 104" from the ambient environment by preventing oxygen and moisture in the ambient environment from entering into the OLED display 100". As shown in FIGS. 10A and 10B, the hermetic seal 108" is typically located just inside the outer edges of the OLED display 100".

Figure 12:
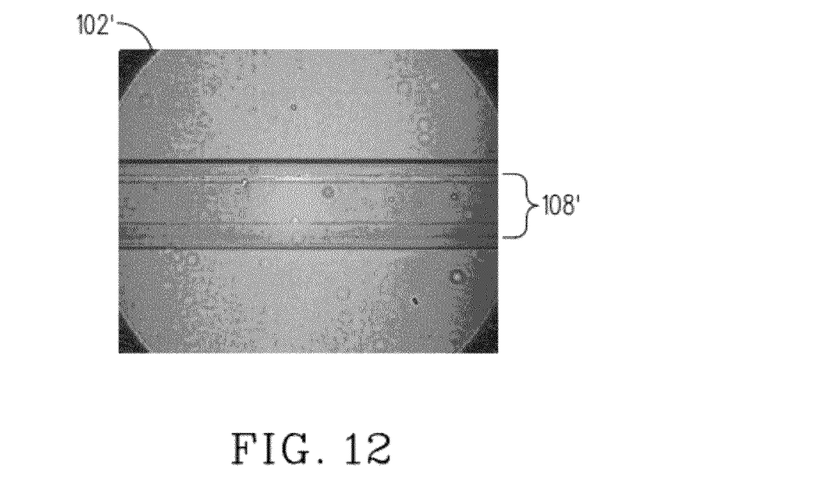
FIG. 12 is a photograph of a top view of a melted fiber which bonded two substrates together using a 25-watt laser beam in accordance with the method shown in FIG. 11.

In the preferred embodiment, step 1110 is performed by using a laser 110 that emits a laser beam 112 through a lens 114 (optional) onto the first substrate plate 102" so as to heat the sealing glass fiber 106" (see FIG. 10B). The laser beam 112 is moved such that it effectively heats and softens the sealing glass fiber 106" so that it can form the hermetic seal 108". Again, the hermetic seal 108" connects the first substrate plate 102 to the second substrate plate 107. In particular, the laser 110 outputs a laser beam 112 having a specific wavelength (e.g., 800 nm wavelength) and the sealing glass fiber 106" is doped with a transition or rare earth metal (e.g., copper, vanadium, iron, manganese, cobalt, nickel, chromium, neodymium, cerium) so as to enhance its absorption property at the specific wavelength of the laser beam 112. This enhancement of the absorption property of the sealing glass fiber 106" means that when the laser beam 112 is emitted onto the sealing glass fiber 106" there is an increase of absorption of heat energy from the laser beam 112 into the sealing glass fiber 106" which causes the sealing glass fiber 106" to soften and form the hermetic seal 108". The substrate glass plates 102" and 107" (e.g., 1737 glass substrate and Eagle 2000 glass substrate) are chosen such that they do not absorb much heat if any from the laser 110. As such, the substrate plates 102 and 107 have a relatively low absorption properties at the specific wavelength of the laser beam 112 which helps to minimize the undesirable transfer of heat from the forming hermetic seal 108" to the OLEDs 104" within the OLED display 100". Again, the OLEDs 104" should not be heated to more than 85° C. during the sealing process. FIG. 12 is photograph of a top view of two substrate plates 102" and 107" (1737glass substrate and Eagle 2000 glass substrate) that were bonded together using a 25-watt laser beam 112 that was moved at 1 cm/s velocity and focused to an approximate spot of 0.2 mm-0.3 mm onto the sealing glass fiber 106" (composition no. 4). The width of the seal 108" in FIG. 12 is approximately 100 microns.

Described below are additional glass compositions of the sealing glass plate 106' (first embodiment) and the sealing glass fiber 106" (second embodiment) and additional laser wavelengths that can be used to form hermetic seals 108' and 108" in OLED displays 100' and 100". In particular, additional glass compositions are described below that are suitable for sealing OLED displays 100' and 100" using an 810 nm infrared (IR) laser 110. Also, glass compositions are described below that are suitable for sealing OLED displays 100' and 100" using a 532 nm visible laser 110. Moreover, glass compositions are described below that are suitable for sealing OLED displays 100' and 100" using a 355 nm ultraviolet (UV) laser 110. Each of these glass compositions are described in detail below with respect to TABLES 3-5.

Referring to IR absorbing glasses, in the text and experiments described above with respect to TABLES 1 and 2, the IR absorbing glasses 106' and 106" which contained transition metal elements had a strong absorption in the infrared range for sealing with an 810 nm laser 110. However, some of the aforementioned glasses like composition nos. 5-8 listed in TABLE 1 which had over about 10 mole % of a transition metal tended to have a dull appearance after pouring and annealing due to the formation of a copper oxide layer on the surface. In these copper borosilicate glasses, it was found that the oxidation phenomenon was dependent on copper and alumina concentrations in the doped glass. In contrast, the surface appearance of the glass composition no. 9 (TABLE 3A) which has a lower Cu plus some Fe did not have a dull appearance and performed well in a 85° C./85RH hermetic performance test (>500 hours).

TABLE 3A

| oxides | comp. #9 mole % | weight % |
|---|---|---|
| $SiO_2$ | 58.5 | 52.06 |
| $Al_2O_3$ | 4 | 6.04 |
| $B_2O_3$ | 28 | 28.87 |
| $Na_2O$ | 0 | 0 |
| $V_2O_5$ | 0 | 0 |
| $Fe_2O_3$ | 1.5 | 3.55 |
| CuO | 8 | 9.42 |

Also, in recent experiments, optical transmission data had been obtained which indicated that there are interactions between some transition metal ions which give rise to significantly higher absorption than predicted by the sum of the individual elements. For instance, glass compositions nos. 10-11 (TABLE 3B) have shown that vanadium ions have a strong interaction with copper and iron ions.

TABLE 3B

| oxides | comp. no. 10 mole % | weight % | comp. no. 11 mole % | weight % |
|---|---|---|---|---|
| $SiO_2$ | 81.84 | 72.37 | 81.84 | 77.16 |
| $Al_2O_3$ | 1.21 | 1.82 | 1.21 | 1.94 |
| $B_2O_3$ | 10.56 | 10.83 | 10.56 | 11.53 |
| $Na_2O$ | 5.38 | 4.9 | 5.38 | 5.22 |
| $V_2O_5$ | 2 | 5.36 | 1 | 2.86 |
| $Fe_2O_3$ | 2 | 4.7 | 0 | 0 |
| CuO | 0 | 0 | 1 | 1.25 |

This synergistic effect of the interaction of metal ions also occurred in glass composition nos. 12-17 (TABLE 3C). As can be seen in TABLE 3C, the increase of absorbing ions by 50% in going from glass composition no. 13 to glass composition no. 17 resulted in the absorption increasing roughly fourfold.

However, referring to glass composition nos. 18-19 (TABLE 3C) it can be seen that by exceeding certain levels of some elements, for instance V, can result in an increase in the CTE to undesirable values. And, referring to glass composition no. 20 it can be seen that when compositions have too much Fe2O3 this can result in phase separation. Phase separation does not necessarily render a glass unsuitable for sealing, but it does make the manufacturing of sheet much more difficult, and is viewed as undesirable.

In view of the data in TABLES 3A-3C, a preferred composition range for infrared sealing glasses 106' and 106" that can be used in this embodiment of the present invention has been determined and is listed in TABLE 3D:

TABLE 3D

| Oxide | Mole % |
|---|---|
| $Fe_2O_3$ | 0.0-5 |
| $V_2O_5$ | 0.0-4 |
| $TiO_2$ | 0.0-5 |
| CuO | 0.0-10 |
| NiO | 0.0-3 |
| $B_2O_3$ | 8-30 |
| $Al_2O_3$ | 1.2-12 |
| $Li_2O$ | 0-2 |
| $Na_2O$ | 0-6 |
| $K_2O$ | 0-3 |
| MO | 0-3 (M = Mg, Ca, Sr, Ba, Zn) |
| Other | 0-3 |
| $SiO_2$ | Balance, typically 45-80 |

Referring now to visible absorbing glasses, these glasses typically contain cobalt ions so they have a very strong absorption in the visible region (450-650 nm) and weaker absorption in the IR region. There are several visible glass composition families that can act as successful hosts to cobalt ions. Examples of these visible glass compositions are shown in TABLE 4A. As can be seen, the high boron glass composition nos. 20-23 have the advantage that they have lower softening and strain points, which means that sealing can be accomplished at somewhat lower laser energy which in turn means the sealing is less likely to cause seal excessive stresses. On the other hand, the high boron glasses and in particular glass composition no. 22 have a greater tendency to

TABLE 3C

| oxide | mole % comp. no. 12 | comp. no. 13 | comp. no. 14 | comp. no. 15 | comp. no. 16 | comp. no. 17 | comp. no. 18 | comp. no. 19 | comp. no. 20 |
|---|---|---|---|---|---|---|---|---|---|
| $SiO_2$ | 65.6 | 68.6 | 69.6 | 69.6 | 69.6 | 67.1 | 73 | 73 | 50 |
| $Al_2O_3$ | 4 | 4 | 4 | 4 | 4 | 4 | 1 | 1 | 9 |
| $B_2O_3$ | 24.2 | 24.2 | 24.2 | 24.2 | 24.2 | 24.2 | 23.6 | 23.6 | 30 |
| $Li_2O$ | 0.2 | 0.2 | 0.2 | 0.2 | 0.2 | 0.2 | 1.5 | 1.5 | 0 |
| $Na_2O$ | 0 | 0 | 0 | 0 | 0 | 0 | 0.5 | 0.5 | 0 |
| $K_2O$ | 0 | 0 | 0 | 0 | 0 | 0 | 0.4 | 0.4 | 0 |
| ZnO | 0 | 0 | 0 | 0 | 0 | 0 | 0 | 0 | 3 |
| $Fe_2O_3$ | 0 | 1 | 1 | 1 | 0 | 1.5 | 0 | 0 | 8 |
| $V_2O_5$ | 2 | 1 | 0 | 1 | 1 | 1.5 | 2 | 4 | 0 |
| CuO | 0 | 0 | 0 | 0 | 0 | 0 | 1 | 1 | 0 |
| $TiO_2$ | 2 | 1 | 1 | 0 | 1 | 1.5 | 0 | 0 | 0 |
| NiO | 0 | 0 | 0 | 0 | 0 | 0 | 0 | 0 | 0 |
| $MnO_2$ | 0 | 0 | 0 | 0 | 0 | 0 | 0 | 0 | 0 |
| CTE | | | | | | | 34 | 41 | na |
| 810 abs | 0.6 | 4.8 | 0.5 | 4 | 0.2 | 18.8 | na | na | na |
| glassy? | yes | yes | yes | yes | yes | | yes | yes | phase sep | undergo phase separation. This phenomenon can be triggered by excessive transition metal additions.

TABLE 4A

| oxide | mole % (comp. 20) | (comp. no 21) | (comp. no 22) | (comp. no 23) |
|---|---|---|---|---|
| $SiO_2$ | 80.8 | 79.8 | 78.8 | 77 |
| $Al_2O_3$ | 1.2 | 1.2 | 1.2 | 0 |
| $B_2O_3$ | 10.6 | 10.6 | 10.6 | 21.4 |
| $Li_2O$ | 0 | 0 | 0 | 0 |
| $Na_2O$ | 5.4 | 5.4 | 5.4 | 0 |
| $K_2O$ | 0 | 0 | 0 | 1.6 |
| $Co_3O_4$ | 2 | 3 | 4 | 1 |
| glassy | yes | yes | phase sep | yes |
| CTE | 42 | 40 | na | 31 |
| abs., mm−1 at 532 nm | | | na | 6 |

The table also shows that in borosilicate glass, $Co_3O_4$ additions are tolerated up to about 3 mole %, after which phase separation takes place, rendering the composition unsuitable for manufacturing. However, in a high boron glass, 1 mole % $Co_3O_4$ appears to be sufficient since it results in an absorption coefficient of 6 mm$^{-1}$, well above the threshold value of about 3 mm$^{-1}$ for successful sealing. It should also be noticed that a low alkali glass like glass composition no. 23 which has a lower CTE than the two lower boron glass composition nos. 20-21 is desirable.

It should be appreciated that most of the aforementioned IR absorbing glasses also absorb strongly in the visible wavelength as well. In fact, there are several transition metals, alone and in combination, which were listed in the description of IR absorbing glasses that can yield useful visible absorption. However, there are several reasons why one would want to have a glass 106' and 106" designed to absorb primarily in the visible region. One such reason is that glasses with strong visible absorption and less strong infrared absorption may be easier to manufacture from the standpoint of melting and forming into a glass sheet. Another reason for using visible absorbing glasses with strong absorptions in the visible region like the ones described above is that they can be used in display devices that have a "bottom emission" geometry, i.e., light is emitted through the transparent OLED substrate glass.

In view of the data associated with TABLE 4A, a preferred composition range for visible sealing glasses 106' and 106" that can be used in this embodiment of the present invention has been determined and as listed in TABLE 4B:

TABLE 4B

| Oxide | Mole % |
|---|---|
| *$Co_3O_4$ | 0.5-3 |
| $B_2O_3$ | 8-30 |
| $Al_2O$ | 1.2-12 |
| $Li_2O$ | 0-2 |
| $Na_2O$ | 0-6 |
| $K_2O$ | 0-3 |
| MO | 0-3 (M = Mg, Ca, Sr, Ba, Zn) |
| Other | 0-3 |
| $SiO_2$ | Balance, typically 45-80 |

*The use of cobalt as an absorber is preferred in this application for at least three reasons. First, while cobalt ions do absorb strongly at the useful laser wavelength of 532 nm, they do not absorb nearly as much in the infrared region. Second, since cobalt is such a strong colorant on a molar or weight basis, smaller additions are required to get to useful absorption levels. Third, cobalt is among the most effective additives because of its higher absorption per mole % oxide added. Following are some more results associated with two experiments that were conducted with cobalt doped glass.

A cobalt doped sample (composition in mole %; $SiO_2$=74.77, $B_2O_3$=20.77, $K_2O$=1.55, $Co_3O_4$=2.91) was sealed to 1737 using a 532 nm continuous wave laser with 8 watts of power at 10 mm/s. To demonstrate that the seal was hermetic a calcium film (0.5 micron thick) was deposited on 1737 substrate in the encapsulated area prior to sealing. The sealed samples w aged in 85° C./85RH to accelerate water diffusion through the seal. There was no change in the appearance of calcium film even after 5000 hours of aging in 85° C./85RH environment. If the calcium film is not protected it will lose its metallic appearance within a few hours under ambient conditions.

And, to prove that harder glasses (higher softening temperature) can be sealed by conducting sealing experiments at elevated temperatures, Corning Code 1737 glass was doped with 2 mole % $Co_3O_4$. This glass was first sealed to 1737 substrate at RT with a 532 nm laser (8 W and 7 mm/s). Cracks were observed both along the seal line and at seal intersections. A similar sample of cobalt doped 1737 was sealed to 1737 by heating the sample to 350° C. using the same laser conditions. This sample did not develop cracks because the thermal stresses generated during sealing are lower compared to RT sealed sample. This indicates that there would be some widening to the aforementioned physical property constraints listed above in TABLE 4B.

Referring now to UV absorbing glasses, there are two types of uv-absorbing glasses 106' and 106" described below. In the first type, borosilicate glasses with Ce and Ce+Ti additions have been found to give adequate absorption for sealing at 355 nm. TABLE 5A lists several glass composition nos. 24-26 where Ce and Ti were added to borosilicate glass.

TABLE 5A

| oxide | mole % (comp. no 24) | (comp. no. 25) | (comp. no. 26) | (comp. no. 27) | (comp. no. 28) |
|---|---|---|---|---|---|
| $SiO_2$ | 80.8 | 78.8 | 76.8 | 62 | 63.6 |
| $Al_2O_3$ | 1.2 | 1.2 | 1.2 | 6 | 6 |
| $B_2O_3$ | 10.6 | 10.6 | 10.6 | 28 | 25 |
| $Li_2O$ | 0 | 0 | 0 | 0 | 0 |
| $Na_2O$ | 5.4 | 5.4 | 5.4 | 0 | 1.4 |
| $K_2O$ | 0 | 0 | 0 | 0 | 0 |
| $CeO_2$ | 1 | 2 | 2 | 4 | 4 |
| $TiO_2$ | 1 | 2 | 4 | 0 | 0 |
| glassy | yes | yes | phase sep | phase sep | yes |
| CTE | 40 | 41 | na | na | 34 |
| abs., mm − 1 355 nm | 6.1 | >10 | na | na | 5.5 |

As can be seen in TABLE 5A with respect to glass composition no. 26, when there is too high a level of Ti in the borosilicate glass this can cause phase separation. It can also be seen that an absorption sufficient for sealing was obtained in glass composition no. 24, although the CTE is a bit high. And, it can be seen in the other high boron glasses like glass composition nos. 27-28 which have lower CTEs and lower strain points that they can be used to make a better seal with substrates which have 40 and below CTEs. However, these high boron glasses also have a greater tendency for phase separation like glass composition no. 27. As such, lower alkali levels may be needed in the high boron glasses to avoid high CTEs. But, lower alkali glasses also give weaker Ce absorption in the UV region. A compromise was reached in glass composition no. 28, where only a small amount of alkali was required to avoid phase separation.

It should be appreciated that the aforementioned UV absorbing glasses are fairly transparent in the visible region (yellow amber color) and have strong absorption at 355 nm. As a result, these UV absorbing glasses may be used to make top emission OLED displays. This is important since the market place is likely to move from bottom emission displays to top emission displays.

Following is an experiment associated with Ce-doped glass, a cerium containing glass sample (composition in mole %: $SiO_2$=63.6, $B_2O_3$=25, $Na_2O$=1.4, $Al_2O_3$=6, $CeO_2$=4; CTE=3.07 ppm/° C. and absorption coefficient at 355 nm=5.52/mm) was sealed to Eagle 2000 substrate using a 355 nm pulsed laser. A calcium film was deposited on Eagle 2000 substrate in the encapsulated area to demonstrate that the seal was hermetic. The sealing conditions used were; average laser power 8.3 W, speed 15 mm/s, pulse frequency=50 kHz, pulse width <30 ns. The sealed sample with calcium film was aged in 85° C./85RH environment. No change in the appearance of the calcium film was noticed even after 2000 hours in 85° C./85RH test.

In view of the data in TABLE 5A, a preferred composition range for UV absorption Ce and Ti addition sealing glasses 106' and 106" that can be used in this embodiment of the present invention has been determined and is listed in TABLE 5B:

TABLE 5B

| Oxide | Mole % |
|---|---|
| $CeO_2$ | 1-4 |
| $TiO_2$ | 0.0-3 |
| $B_2O_3$ | 8-30 |
| $Al_2O_3$ | 1.2-12 |
| $Li_2O$ | 0-2 |
| $Na_2O$ | 0-6 |
| $K_2O$ | 0-3 |
| MO | 0-3 (M = Mg, Ca, Sr, Ba, Zn) |
| Other | 0-3 |
| $SiO_2$ | Balance, typically 45-80 |

In the second type of UV absorbing glasses, these visibly transparent glasses which are capable of being sealed with 355 nm UV lasers are made by precipitation of CuCl microcrystals in a glass matrix. The precipitation of CuCl in the glass is controlled by the heat treatment, the level of Cu and Cl, the ratio of alkalis to boron, and the redox state of the glass. These glasses possess a very sharp UV cut-off absorption at about 370 nm and, depending on the composition, can have absorption coefficients of over 6 $mm^{-1}$" at 355 nm.

TABLE 5C illustrates an exemplary range of glass compositions in which CuCl microcrystals can be precipitated. Glass composition no. 29 is equivalent to Corning's Code 8511 glass, and glass composition no. 7 is equivalent to Corning's Spectramax product. As can be seen, the CTE of glass composition no. 29 is too high, but it can be lowered by increasing $SiO_2$ and lowering $Al_2O_3$ and total alkalis ($Li_2O$+$Na_2O$+$K_2O$).

TABLE 5C

| oxide | mole % comp. no. 29 | comp. no. 30 | comp. no. 31 | comp. no. 32 | comp. no. 33 | comp. no. 34 | comp. no. 35 | comp. no. 36 |
|---|---|---|---|---|---|---|---|---|
| $SiO_2$ | 59.7 | 61.2 | 67 | 72.8 | 75.3 | 76.2 | 77.2 | 71.2 |
| $Al_2O_3$ | 11.4 | 2.7 | 3.8 | 4.9 | 2.5 | 1.9 | 1.2 | 1.9 |
| $B_2O_3$ | 17.2 | 28.4 | 21.5 | 14.5 | 15.8 | 14.3 | 12.8 | 19.5 |
| $Li_2O$ | 2 | 1.3 | 0.6 | 0 | 0 | 0 | 0 | 0 |
| $Na_2O$ | 4.5 | 5.3 | 5.9 | 6.6 | 5.4 | 5.1 | 4.8 | 7.4 |
| $K_2O$ | 3.2 | 0 | 0 | 0 | 0 | 0 | 0 | 0 |
| CuO | 0.4 | 0.3 | 0.4 | 0.4 | 0.4 | 0.4 | 0.4 | 0.31 |
| $SnO_2$ | 0.5 | 0.8 | 0.5 | 0.7 | 0.7 | 0.7 | 0.7 | 0.15 |
| Br | 0.25 | 0.5 | 0.25 | 0.5 | 0.5 | 0.5 | 0.5 | 0.4 |
| Cl | 0.06 | 0.75 | 0.06 | 0.75 | 0.75 | 0.75 | 0.75 | 1.4 |
| F | 0 | 0 | 0 | 0.75 | 0.75 | 0.75 | 0.75 | 1.3 |
| glassy | yes | | | | | | | |
| CTE | 59 | 46 | 44 | 43 | 37 | 37 | 34 | na |
| abs., mm − 1 355 nm | | | | | | | | 2.9 |

In view of the data in TABLE 5C, a preferred composition range for UV absorption CuCl microcrystal sealing glasses 106' and 106" that can be used in this embodiment of the present invention has been determined and is listed below in TABLE 5D:

TABLE 5D

| Oxide | Mole % |
|---|---|
| $Al_2O$ | 0-15 |
| $B_2O_3$ | 10-30 |
| $Li_2O$ | 0-3 |
| $Na_2O$ | 3-8 |
| $K_2O$ | 0-4 |
| CuO | 0.2-1 |
| SnO | 0.1-1 |
| Br | 0.2-1 |
| Cl | 0-2 |
| F | 0-6 |
| $CeO_2$ | 0-3 |
| $SiO_2$ | balance, typically 50-80%. |

It should be appreciated that different types of UV absorbing glasses like the ones shown in TABLES 5A-5D can be used to form seals using a 355 nm pulsed laser with high repetition rate.

In the foregoing discussion related to TABLES 3-5, 1737 or Eagle glass was used as the transparent substrate. However, it should be noted that if another glass, with better uv transparency, was used as the transparent substrate, then one could use a laser wavelength in the transparency region of that substrate glass. For example, if high purity fused silica was used then a 266 nm laser could be used to seal the plates.

Figure 13:
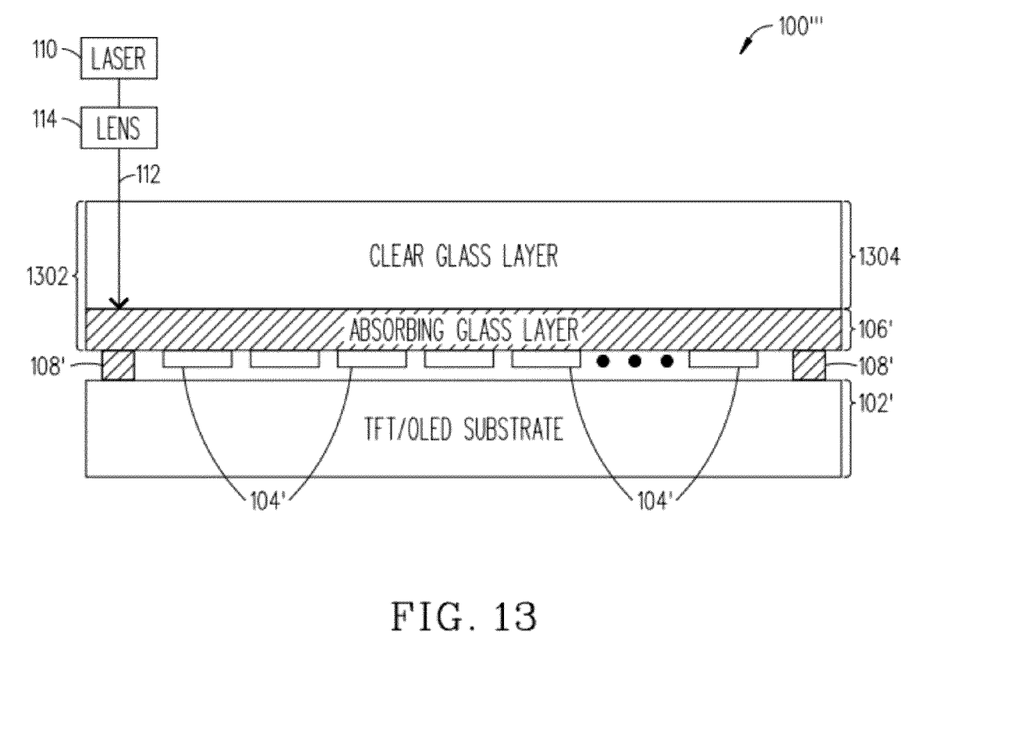
FIG. 13 is a cross-sectional side view illustrating a laminated sealing glass plate that can be used to make a hermetically sealed OLED display or a glass package in accordance with yet another embodiment of the present invention.

In yet another embodiment of the present invention, any of the aforementioned sealing glass compositions can be used in at least one layer of a laminated glass 1302 which can be sealed to a transparent glass 102' so as to make a glass package which is not shown or to make a hermetically sealed OLED display 100''' as shown in FIG. 13. In the preferred embodiment, the laminated glass 1302 would be a two-layer glass sheet with a total thickness of typically 1 mm or less, where one of the layers is an absorbing glass 106' and the second layer is a clear, non-absorbing glass 1304 as viewed from the standpoint of the wavelength of the laser 110 used for sealing. In the preferred embodiment, the portion of the laminate glass 1302 that is absorbing glass 106' would typically be a third or less of the total thickness, giving an absorbing layer thickness of between about 150 microns and 75 microns. The rest of the laminated sheet 1302 would be clear glass 1304.

An advantage of using the laminated sheet 1302 is that it makes it easier to form a hermetic seal 108' from the back, i.e. the non-TFT/OLED substrate 102' side. This is shown in FIG. 13, where the sealing laser 110 emits a laser beam 112 through the lens 114 (optional) and at the layer of clear glass 1304 in the laminate glass 1302 and then into the layer of absorbing glass 106', causing the absorbing glass 106' to heat, soften, and swell to contact and seal to the substrate glass 102'.

An advantage of the laminated concept is that less absorbing glass 106' is required, compared to a monolithic sheet, which may be more economical. Also, because the absorbing layer 106' is thin, depending on the absorption coefficient, the laminated sheet 1302 can be much more transmissive in the visible wavelengths, which may allow for "top emission" for some absorbing glasses 106' that would not have been suitable in thicker sheets.

Following are some of the different advantages and features of the present invention:

The hermetic seal 108' and 108" has the following properties:
Good thermal expansion match to glass substrate plates 102', 102" and 107".
Low softening temperature.
Good chemical and water durability.
Good bonding to glass substrate plates 102', 102" and 107".
Seal is dense with very low porosity.

The doped sealing glass plate 106' can be any type of glass that has the ability to swell. For instance, glasses that have the ability to swell in addition to the ones listed in TABLE 1 include Pyrex™ and Corning Codes 7890, 7521 or 7761. There are other considerations in addition to having a doped sealing glass 106' and 106" that can swell which should also be taken into account in order to form a "good" hermetic seal 108' and 108". These considerations include having the right match between the CTEs and the viscosities of the sealed glasses. It should be noted that residual stress measurements have indicated that it is preferable to have the CTE of the sealing glass 106' and 106" the same as or lower than the CTE of the substrate glass 102', 102" and 107". Other considerations to achieve a "good" hermetic seal 108' and 108" include choosing the right conditions such as laser power, focusing and velocity of sealing.

It is important to understand that other types of substrate plates 102" and 107" besides the Code 1737 glass plates and EAGLE 2000™ glass plates can be sealed to one another using the sealing process of the present invention. For example, glass plates 102" and 107" made by companies such as Asahi Glass Co. (e.g., OA10 glass and OA21 glass), Nippon Electric Glass Co., NHTechno and Samsung Corning Precision Glass Co. can be sealed to one another using the sealing process of the present invention.

The OLED display 100 can be an active OLED display 100 or a passive OLED display 100.

The sealing glass plate and sealing glass fiber of the present invention can be designed to absorb heat in other regions besides the infrared region described above.

Although several embodiments of the present invention has been illustrated in the accompanying Drawings and described in the foregoing Detailed Description, it should be understood that the invention is not limited to the embodiments disclosed, but is capable of numerous rearrangements, modifications and substitutions without departing from the spirit of the invention as set forth and defined by the following claims.

What is claimed is:

1. A method of forming a glass package comprising:
   a) providing a sealing glass plate comprising a transition metal or rare earth element selected so that the sealing glass plate absorbs light at a predetermined wavelength;
   b) providing a glass substrate that does not absorb light at the predetermined wavelength;
   c) directing a laser beam comprising light at the predetermined wavelength onto a predetermined portion of the sealing glass-plate; and
   wherein the predetermined portion of the sealing glass plate absorbs light from the laser beam in an amount sufficient to heat the predetermined portion and form a hermetic seal connecting the sealing glass plate and the glass substrate plate.

2. The method according to claim 1, further comprising depositing one or more organic layers on the glass substrate plate.

3. The method according to claim 1, wherein the predetermined portion of the sealing glass plate swells in response to heating by the laser beam.

4. The method according to claim 3, wherein the sealing glass plate has the following composition:

| | |
|---|---|
| $Fe_2O_3$ | 0-5 (mole %) |
| $V_2O_5$ | 0-4 (mole %) |
| $TiO_2$ | 0-5 (mole %) |
| CuO | 0-10 (mole %) |
| NiO | 0-3 (mole %) |
| $B_2O_3$ | 8-30 (mole %) |
| $Al_2O_3$ | 1.2-12 (mole %) |
| $Li_2O$ | 0-2 (mole %) |
| $Na_2O$ | 0-6 (mole %) |
| $K_2O$ | 0-3 (mole %) |
| MO | 0-3 (mole %) (M = Mg, Ca, Sr, Ba, Zn) |
| Other | 0-3 (mole %) |
| $SiO_2$ | balance. |

5. The method according to claim 1, wherein the sealing glass plate is formed from a borosilicate glass comprising at least one transition or rare earth metal selected from the group consisting of iron, copper, vanadium, manganese, cobalt, nickel, chromium, neodymium and cerium.

6. The method according to claim 1, wherein the glass package comprises an organic light emitting display device.

7. The method according to claim 1, wherein the laser beam is directed through the substrate plate onto the sealing glass plate.

8. The method according to claim 1, wherein a coefficient of thermal expansion of the glass of the sealing glass plate is equal to or less than the coefficient of thermal expansion of the glass of the glass substrate.

9. The method according to claim 1, wherein the sealing glass plate in step a) is a laminated glass.

10. The method according to claim 9, wherein the laminated glass is a two layer glass comprising a layer that does not absorb light at the predetermined wavelength.

11. The method according to claim 10, wherein a thickness of the layer that does not absorb light at the predetermined wavelength is between about 75 microns and 150 microns.

12. A method of forming an organic light emitting diode display comprising:
   a) providing a sealing glass plate comprising a transition metal or rare earth element selected so that the sealing glass plate absorbs light at a predetermined wavelength;
   b) providing a glass substrate plate that does not absorb light at the predetermined wavelength;
   c) depositing one or more organic layers on the glass substrate plate;
   d) heating a predetermined portion of the sealing glass plate inward of an outer edge of the sealing glass plate with a laser through the glass substrate plate; and
   wherein the heating causes the predetermined portion of the sealing glass plate to swell and form a ridge that creates a gap between the sealing glass plate and the glass substrate plate, and wherein the ridge joins the sealing glass plate to the glass substrate plate with a hermetic seal.

13. The method according to claim 12, wherein the sealing glass plate is formed from a borosilicate glass comprising at least one transition or rare earth metal selected from the group consisting of iron, copper, vanadium, manganese, cobalt, nickel, chromium, neodymium and cerium.

14. The method according to claim 12, wherein the sealing glass plate has the following composition:

| | | |
|---|---|---|
| $Fe_2O_3$ | 0-5 | (mole %) |
| $V_2O_5$ | 0-4 | (mole %) |
| $TiO_2$ | 0-5 | (mole %) |
| CuO | 0-10 | (mole %) |
| NiO | 0-3 | (mole %) |
| $B_2O_3$ | 8-30 | (mole %) |
| $Al_2O_3$ | 1.2-12 | (mole %) |
| $Li_2O$ | 0-2 | (mole %) |
| $Na_2O$ | 0-6 | (mole %) |
| $K_2O$ | 0-3 | (mole %) |
| MO | 0-3 | (mole %) (M = Mg, Ca, Sr, Ba or Zn) |
| Other | 0-3 | (mole %) |
| $SiO_2$ | balance. | |

15. The method according to claim 12, wherein the sealing glass plate in step a) is a laminated glass.

16. The method according to claim 15, wherein the laminated glass is a two layer glass comprising a layer that does not absorb light at the predetermined wavelength.

17. The method according to claim 16, wherein a thickness of the layer that does not absorb light at the predetermined wavelength is between about 75 microns and 150 microns.

18. A method of forming a glass package comprising:
   a) providing a sealing glass plate comprising a transition metal or rare earth element selected so that the sealing glass plate absorbs light at a predetermined wavelength;
   b) providing a glass substrate that does not absorb light at the predetermined wavelength;
   c) directing a laser beam comprising light at the predetermined wavelength through the glass substrate onto a predetermined portion of the sealing glass plate; and
   wherein the predetermined portion of the sealing glass plate absorbs light from the laser beam in an amount sufficient to heat the predetermined portion and connect the sealing glass plate to the glass substrate plate.

19. The method according to claim 18, wherein the sealing glass plate is lead free.

* * * * *